(12) United States Patent
Bedeschi

(10) Patent No.: US 8,719,647 B2
(45) Date of Patent: May 6, 2014

(54) READ BIAS MANAGEMENT TO REDUCE READ ERRORS FOR PHASE CHANGE MEMORY

(75) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 13/327,673

(22) Filed: Dec. 15, 2011

(65) Prior Publication Data

US 2013/0159796 A1    Jun. 20, 2013

(51) Int. Cl.
*G11C 29/00*    (2006.01)

(52) U.S. Cl.
USPC .......................... 714/721; 714/755; 714/769

(58) Field of Classification Search
USPC ......... 714/721, 701, 704, 755, 761, 769, 774, 714/758, 788
See application file for complete search history.

(56) References Cited

U.S. PATENT DOCUMENTS

| | | | |
|---|---|---|---|
| 4,864,573 A * | 9/1989 | Horsten ........................ 714/704 |
| 7,333,364 B2 | 2/2008 | Yu et al. |
| 7,400,526 B2 * | 7/2008 | Schoenauer et al. .......... 365/163 |
| 7,872,909 B2 | 1/2011 | Song et al. |
| 8,380,909 B2 * | 2/2013 | Borchers et al. .............. 710/263 |
| 2007/0011513 A1 | 1/2007 | Biswas et al. |
| 2009/0164710 A1 | 6/2009 | Choi et al. |
| 2009/0290418 A1 | 11/2009 | Han |

FOREIGN PATENT DOCUMENTS

| | | |
|---|---|---|
| KR | 10-2009-0089657 | 8/2009 |
| WO | WO 2008-057822 | 5/2008 |

OTHER PUBLICATIONS

International Search Report and Written Opinion for application No. PCT/US2012/064224. mailed Mar. 29, 2013, by Sung Cheal Byun.

\* cited by examiner

*Primary Examiner* — Fritz Alphonse
(74) *Attorney, Agent, or Firm* — Knobbe, Martens, Olson & Bear, LLP

(57) ABSTRACT

Subject matter disclosed herein relates to a memory device, and more particularly to read performance of phase change memory. During a reading process, a bias condition can be applied to a memory cell to determine the memory cell's state. The determined state of the memory cell can depend on a threshold voltage of the memory cell. The threshold voltage of the memory cell may shift over time. The shift in threshold voltage may result in read errors. The applied bias condition may be modified based on the resulting read errors.

20 Claims, 4 Drawing Sheets

READ BIAS MANAGEMENT TO REDUCE READ ERRORS FOR PHASE CHANGE MEMORY

BACKGROUND

1. Field

Subject matter disclosed herein relates to a memory device, and more particularly to read performance of phase change memory.

2. Information

Phase change memory (PCM) may operate based, at least in part, on behavior and properties of one or more particular phase change materials, such as chalcogenide alloy and/or germanium antimony telluride (GST), just to name a few examples. Crystalline and amorphous states of such materials may have different electrical resistivities, thus presenting a basis by which information may be stored. An amorphous, high resistance state of such materials may represent a stored first binary state and a crystalline, low resistance state of such materials may represent a stored second binary state. Of course, such a binary representation of stored information is merely an example: PCM may also be used to store multiple memory states, represented by varying degrees of phase change material resistivity, for example.

A PCM cell may transition from an amorphous state to a crystalline state by applying a bias signal to the memory cell. Characteristics of a bias signal, such as peak magnitude and/or pulse width, for example, may be selected to allow a transition to a crystalline state. Reading a state of a PCM cell may be performed by applying a bias current or voltage to the PCM cell to detect the cell's resistivity.

Over time, various parameters of a PCM cell may drift or change as a result of changing PCM temperature, re-crystallization of phase change material, drift, and/or cycling, just to name a few examples. Such effects may lead to read errors of the PCM cell.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
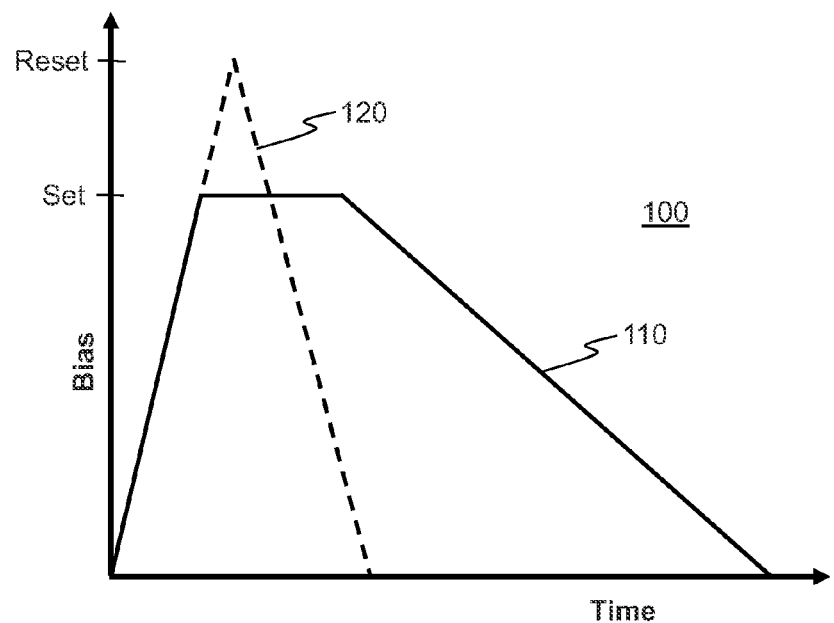
FIG. 1 is a plot of characteristics of bias signal waveforms, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Embodiments described herein include processes and/or electronic architecture involving managing read bias conditions for phase change memory (PCM) devices. As explained in detail below, such read bias conditions may comprise voltage or current applied to PCM cells to determine the state of the PCM cells. Managing read bias conditions of PCM cells may be used to avoid read errors and/or reduce the number of such read errors that may otherwise result from, for example, a shift in state distribution of PCM cells that may occur over time, as described below. A state distribution of a memory cell, for example, may correspond to one or more threshold voltages corresponding to states or logic levels stored by the memory cell. In other words, such states or logic levels may correspond to voltage ranges separated by one or more threshold voltages. For example, a first logic level may correspond to a first voltage range and a second logic level may correspond to a second voltage range. Such logic levels may correspond to one-bit data, such as "0" for a first logic level, and "1" for a second logic level, for example.

To describe one approach among a number of techniques, such logic levels stored in PCM cells may be read and determined based, at least in part, on the same one or more reference cell currents used to previously program the PCM cells. A cell current during a read process may result by applying a read voltage (e.g., a read bias condition, as described below) across a PCM cell so that the cell current during the read process may depend, at least in part, on a resistance of the PCM cell. Accordingly, the state or logic value of a PCM cell, e.g., level of resistance, may be determined by comparing such a cell current during the read process to reference cell currents applied while programming the state or logic value earlier. Over time, however, cell current for a particular voltage applied across a PCM cell may drift or change due to changes in physical properties (e.g., resistance and/or temperature changes) of the PCM cell, for example. Such changes, for example, may result from changes in various physical phenomena, such as resistivity drift of PCM material, temperature changes, retention, and so on. Such changes may occur during a time span prior to reading the memory cell. In one implementation, read errors may be a manifestation of such a change. For example, read errors may increasingly occur as changing physical properties of a memory cell continue to shift a threshold voltage of the memory cell upward or downward. Accordingly, in an embodiment, a method of reading a memory cell programmed at a particular program current or voltage may include modifying one or more read bias conditions to compensate for such changes in physical properties of the memory cell.

In an embodiment, compensating for a change in physical properties of a memory cell, as described above, may be performed in response to an error correction code (ECC) overflow event, described in detail below. Such an ECC overflow event may be indicated by an ECC engine. In one implementation, such an ECC engine may be located in a memory device that includes the memory cell. For example, a memory controller located in a memory device may include an ECC engine. In another implementation, such an ECC engine may be located outside the memory device, such as in a processor, an operating system, and/or an application, just to name a few examples. In the latter implementation, the ECC engine may receive read data from a memory controller, for example, in a memory device and provide the memory controller with error correction code, as described below.

An ECC engine may generate ECC as part of a process to confirm validity (e.g., correctness) of data read from memory and/or to correct such read data if errors are found. For example, a read process may include reading data from memory, generating ECC based, at least in part, on the read data, and using the ECC to detect read errors, if any. In the case of detected read errors, ECC may be used to correct such read errors. In another example, a write process may include writing data to memory, reading just-written data from the memory to confirm that data was correctly written, generating ECC based, at least in part, on the read data, and using the ECC to detect write errors, if any. In the case of detected write errors, ECC may be used to correct such write errors. An ECC engine may be designed for a capability to correct a particular number of errors in data. An ECC overflow event may result if the number of errors detected in data exceeds such a capability, wherein such errors in the data may not be corrected. In particular, a method of reading a memory cell may include a process of modifying a read bias condition based, at least in part, on ECC techniques and/or occurrence of read errors. In detail, contents of a memory device may be read using a bias condition, such as a read voltage or read current. Read errors resulting from reading contents of the memory device may be counted. The read bias condition may then be modified if the number of read errors exceeds a particular number. In one implementation, such a particular number may be based, at least in part, on ECC capability to correct errors. For example, a relatively modest ECC implementation may have a capability to correct two errors while a relatively robust ECC implementation may have a capability to correct four or more errors. Accordingly, a read bias condition may be modified so as to attempt to prevent the number of read errors from exceeding a correcting-capability of an ECC implementation. Of course, such numbers and details of ECC implementation are merely examples, and claimed subject matter is not so limited.

In one implementation, an ECC process may be used to supplement programmed (or write) data with parity bits that include enough extra information for the data to be reconstructed if one or more bits of the data become corrupted. Such an ECC process may generate coded data (e.g., a codeword) based, at least in part, on programmed data, parity of the programmed data, details of the ECC process, and so on. For example, such coded data representing stored data may be applied during a process of reading the stored data and/or a process of verify-after-writing the data. In a particular implementation, coded data may be based, at least in part, on parallel encoding and decoding techniques. Such techniques may involve a 2-bit error correcting binary Bose-Chaudhuri-Hocquenghem (BCH) code, Reed-Solomon code, or a Convolutional code, just to name a few examples.

In an embodiment, coded data may comprise multiple bits of logic 1's or 0's. The number of 1's and the number of 0's of a particular ECC word may be counted. From such counts, a determination may be made as to whether the coded data comprises more 1's than 0's or vise versa. Such a situation may be called "bit imbalance". In a number of ECC implementations, a bit imbalance may indicate that a threshold voltage and/or resistivity of one or more memory cells drifted from the time the memory cells were programmed. For example, if coded data comprises more 1's than 0's, then a memory cell's threshold voltage may have drifted upward from the memory cell's threshold voltage level during programming. In such a case, a read bias condition such as a read voltage or read current may be decreased to compensate for such upward drift of threshold voltage. On the other hand, if coded data comprises more 0's than 1's, then threshold voltage may have drifted downward from the memory cell's threshold voltage level during programming. In such a case, a read bias condition such as a read voltage or read current may be increased to compensate for such downward drift of threshold voltage. As described in detail below, such increasing or decreasing a read bias voltage or current may be performed stepwise while iteratively determining whether subsequent read error events diminish. Of course, such details describing read bias condition compensation are merely examples, and claimed subject matter is not so limited.

FIG. 1 is a plot 100 of characteristics of bias signal waveforms that may be used to program a PCM cell, according to an embodiment. A PCM cell may be reset by melting phase change material by applying a relatively high amplitude, relatively short duration electrical programming pulse, or bias signal 120. In a reset state, an active region of phase change material may comprise an amorphous region that is dome-shaped, disposed adjacent to a heater element in a PCM cell, for example. Crystallized phase change material may surround such an amorphous region. In such a state, a PCM cell may have a relatively high electrical resistance. In a subsequent process, a PCM cell may be set by crystallizing a dome-shaped amorphous region so that a substantially entire region of phase change material may be crystalline. Such a process may involve ramping down a voltage and/or current of relatively low amplitude, relatively long duration bias signal 110 applied to a PCM cell to crystallize the PCM cell's phase change material. In such a state, a PCM cell may have a relatively low electrical resistance. In an implementation, a particular bias signal 120 may be selected to set a PCM cell to a particular state corresponding to a particular range of resistances. For example, bias signal 120 may be decreased in duration and/or amplitude. However, such a particular range of resistances may vary or drift from the time that a PCM cell is programmed to the time that the PCM cell is read. For example, PCM cells may comprise amorphous material that may drift towards higher resistivity, particularly if crystallization of the material is not complete, such as in PCM cells used in a multilevel application. PCM cells may comprise amorphous material that may evolve towards a crystalline state, which may involve thermodynamically lower energy states. In addition, cycling through states of a PCM cell may also affect distribution of read currents or thresholds. Of course, such details of PCM cells are merely examples, and claimed subject matter is not so limited.

Figure 2:
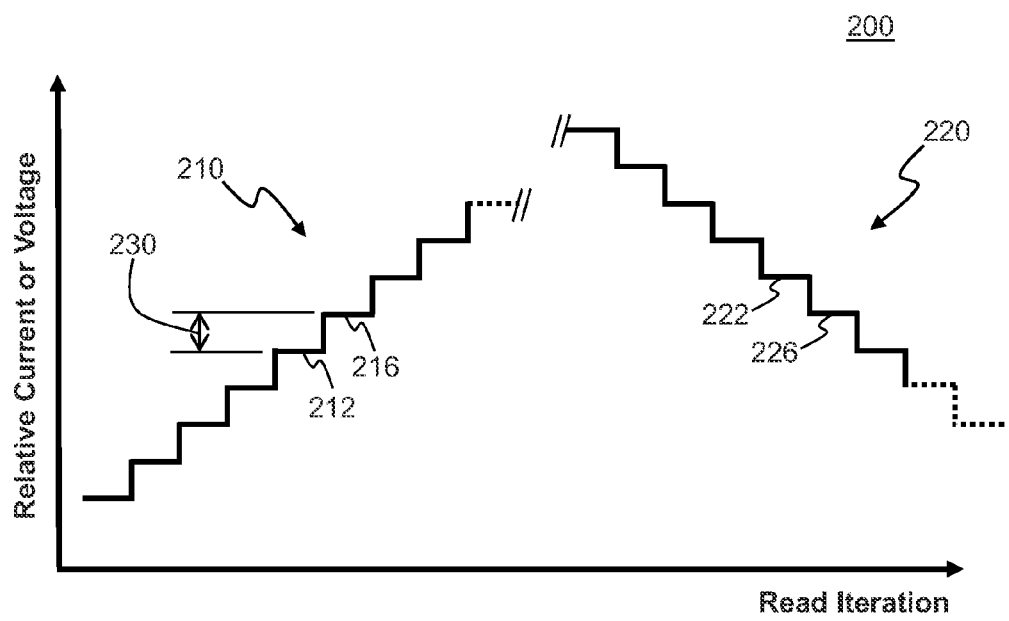
FIG. 2 is a plot of characteristics of reference current or voltage values, according to an embodiment.

FIG. 2 is a plot 200 of characteristics of read bias current or voltage values for a memory array, according to an embodiment. In detail, plot 200 comprises plots of read bias current or voltage as a function of the number of read iterations in a process of reading a memory array. For sake of clarity, read bias current or voltage will hereinafter be referred to as read voltage or read bias. However, descriptions involving voltage may be replaced with descriptions involving current, with any proper change clear to those skilled in the art. In any case, claimed subject matter is not limited in this respect. Plot 210 comprises increasing steps of read voltage that may be iteratively applied to one or more memory cells. For example, read voltage 212 may be applied to one or more memory cells during one iteration of a process to read contents of the memory cells, whereas read voltage 216 may be applied to the memory cells during a subsequent iteration. Similarly, as shown by plot 220, read voltage 222 may be applied to one or more memory cells during one iteration of a process to read contents of the memory cells, whereas read voltage 226 may be applied to the memory cells during a subsequent iteration. Such iterations, for example, may comprise a process of reading, counting read errors (if any), and/or determining whether to increase read voltage or decrease read voltage based, at least in part, on the number of counted read errors. Step size 230 from one read voltage value to a subsequent read voltage value may vary from one implementation to another. For example, in one implementation, step size 230 may vary from one iteration step to another iteration step. In another implementation, step size 230 may be remain constant from one iteration step to another iteration step. For example, step sizes may comprise a voltage in the range of tens to hundreds of millivolts. Though plot 200 shows particular number of iterations, such a number of iterations may vary from one implementation to another. For example, such a number of iterations may be based, at least in part, on step size 230, results of increasing or decreasing bias voltage on the number of read error events, particular algorithms used to read from memory, and so on. For example, one particular algorithm may involve determining a rate at which error events diminish as a result of stepping through values of read voltage. Another particular algorithm may step through values of read voltage a particular number of times regardless of the effects on resulting read errors. Of course, any number of algorithms may be involved, and claimed subject matter is not so limited.

Figure 3:
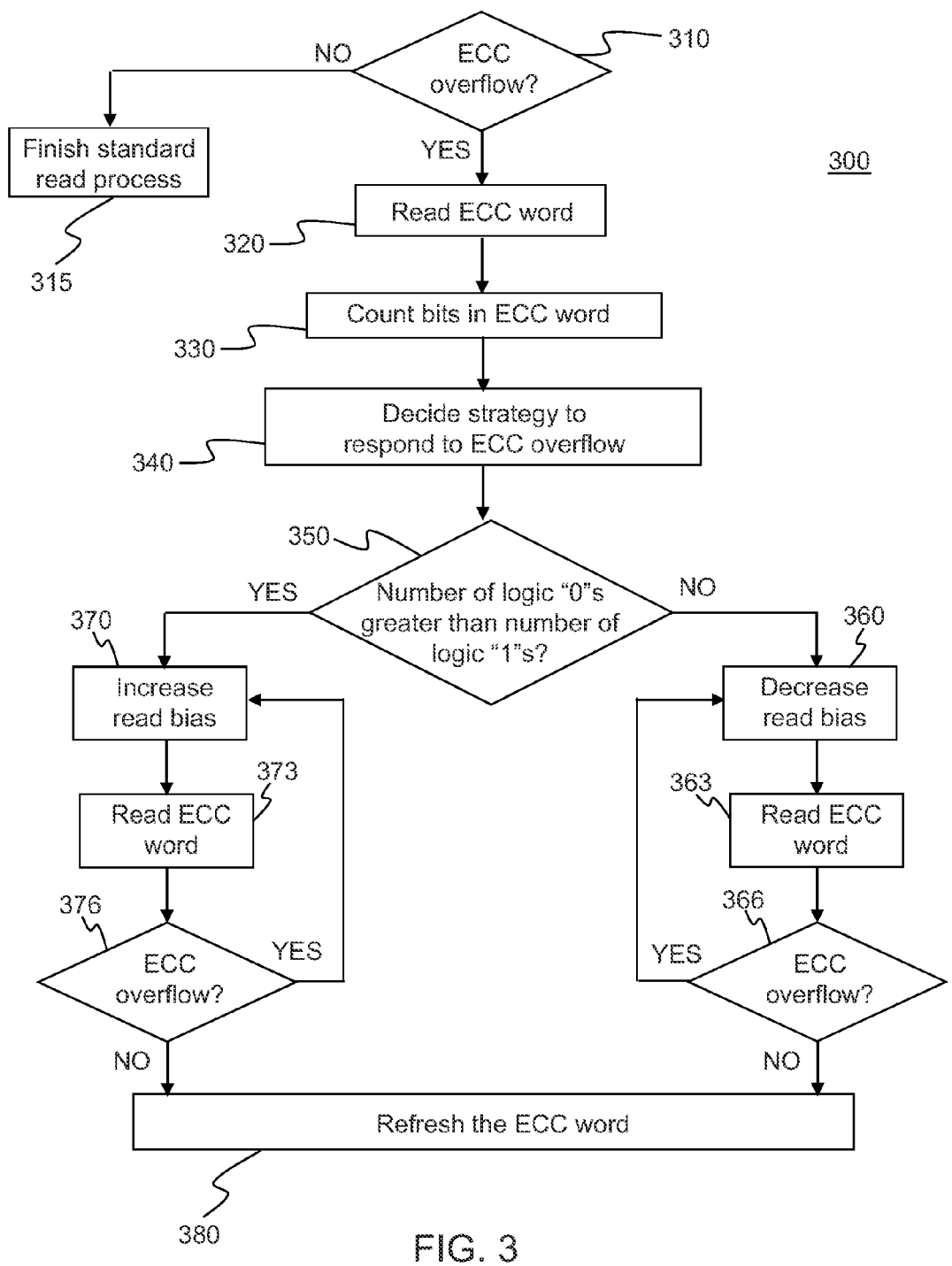
FIG. 3 is a flow diagram of a read process to read contents of a memory array, according to an embodiment.

FIG. 3 is a flow diagram of a read process 300 to read contents of a memory array, according to an embodiment. Such a read process may be performed by a memory controller in response to receiving a read request from a processor. For example, a processor may execute an application resulting in a read request directed to a memory controller, which may perform read process 300, though claimed subject matter is not so limited. Read process 300 may involve an ECC engine to detect and/or correct read errors, as described above. Accordingly, subsequent to reading contents of a memory array, such an ECC engine may be used to correct read errors that may have occurred. However, an ECC engine may be limited in its capability to correct more than a particular number of errors. An ECC overflow may occur if the number of read errors exceeds such a particular number. At diamond 310, a determination may be made as to whether such an ECC overflow has occurred. If not, then process 300 may proceed to block 315 where read process 300 may be completed with read errors (if any) being corrected by a capable ECC engine. However, if an ECC overflow has occurred, then the ECC engine is not capable of correcting any or all of the read errors that led to the ECC overflow. In such a case, process 300 may proceed to block 320 where coded data may be retrieved from the ECC engine, for example. As discussed above, such coded data may comprise multiple bits of logic 1's or 0's. In an implementation, coded data may be generated by combining a data word with parity code bits obtained by processing the data word with a deterministic algorithm, for example. If coded data is retrieved from a memory array then these parity code bits may be compared to parity code bits corresponding to the original data. If the two sets of parity code bits do not match the data word may be changed accordingly until the parity bits match. Consequently, errors present in the data word may be corrected. In block 330, the number of 1's and the number of 0's of a particular ECC word may be counted. From such counts, a determination may be made as to whether the ECC word comprises a bit imbalance, having more 1's than 0's or vise versa. At block 340, a strategy to respond to an ECC overflow may be determined based, at least in part, on whether an ECC word comprises a bit imbalance. If so, then process 300 may proceed to diamond 350 where a determination may be made as to whether the ECC word comprises a greater number of 0 bits than 1 bits. If so, then process 300 may proceed to block 370, where read voltage may be increased. Such an increase may compensate for a possibility that threshold voltage of a memory array may have drifted downward from the memory array's threshold voltage level during programming, as discussed above. Such a read voltage increase may be similar to a voltage increase represented by step size 230 shown in FIG. 2, for example. At block 373, a process to read contents of the memory array may be performed again, this time using a higher read voltage than that used in the previous read (e.g., performed prior to diamond 310). Such a read process may result in read errors, which may be detected using an ECC word generated by an ECC engine involved in the read process. In one case, the number of read errors may be fewer than the number of read errors that resulted from the previous read. Although such a number of read errors may be fewer, the number of read errors may still be in excess of an error-correcting capability of an ECC engine. Such a case may thus involve an ECC overflow, as determined at diamond 376. In the event of an ECC overflow, process 300 may return to block 370 and read voltage may be increased again to further attempt to compensate for a possibility that threshold voltage of a memory array may have drifted downward from the memory array's threshold voltage level during programming. Accordingly, process 300 may loop through an iterative process of increasing read voltage, reading contents of a memory array, determining whether the number of resulting read errors exceeds an error-correcting capability of an ECC engine, and if so, repeating the iterative process. On the other hand, if the number of resulting read errors is within an error-correcting capability of an ECC engine, process 300 may proceed to block 380, where an ECC word may be refreshed. This may mean that a new data code is generated following a procedure similar or the same as that described above for the ECC engine operation. A new programming phase may restore corrected content, thus nullifying drift that may have occurred for some or all bits, for example.

On the other hand, returning to diamond 350, if an ECC word comprises more 1's than 0's, then process 300 may proceed to block 360, where read voltage may be decreased. Such a decrease may compensate for a possibility that threshold voltage of a memory array may have drifted upward from the memory array's threshold voltage level during programming, as discussed above. Such a read voltage decrease may be similar to step size 230 shown in FIG. 2, for example. At block 363, a process to read contents of the memory array may be performed again, this time using a lower read voltage than that used in the previous read (e.g., performed prior to diamond 310). Such a read process may result in read errors, which may be detected using an ECC word generated by the ECC engine involved in the read process. In one case, the number of read errors may be fewer than the number of read errors that resulted from the previous read. Although such a number of read errors may be fewer, the number of read errors may still be in excess of an error-correcting capability of an ECC engine. Such a case may thus involve an ECC overflow, as determined at diamond 366. In the event of an ECC overflow, process 300 may return to block 360, and read voltage may be decreased again to further attempt to compensate for a possibility that threshold voltage of a memory array may have drifted upward from the memory array's threshold voltage level during programming. Accordingly, process 300 may loop through an iterative process of decreasing read voltage, reading contents of a memory array, determining whether the number of resulting read errors exceeds an error-correcting capability of an ECC engine, and if so, repeating the iterative process. On the other hand, if the number of resulting read errors is within an error-correcting capability of an ECC engine, process 300 may proceed to block 380, where new coded data may be generated by an ECC engine, as previously explained. Of course, such details of process 300 are merely examples, and claimed subject matter is not so limited.

Figure 4:
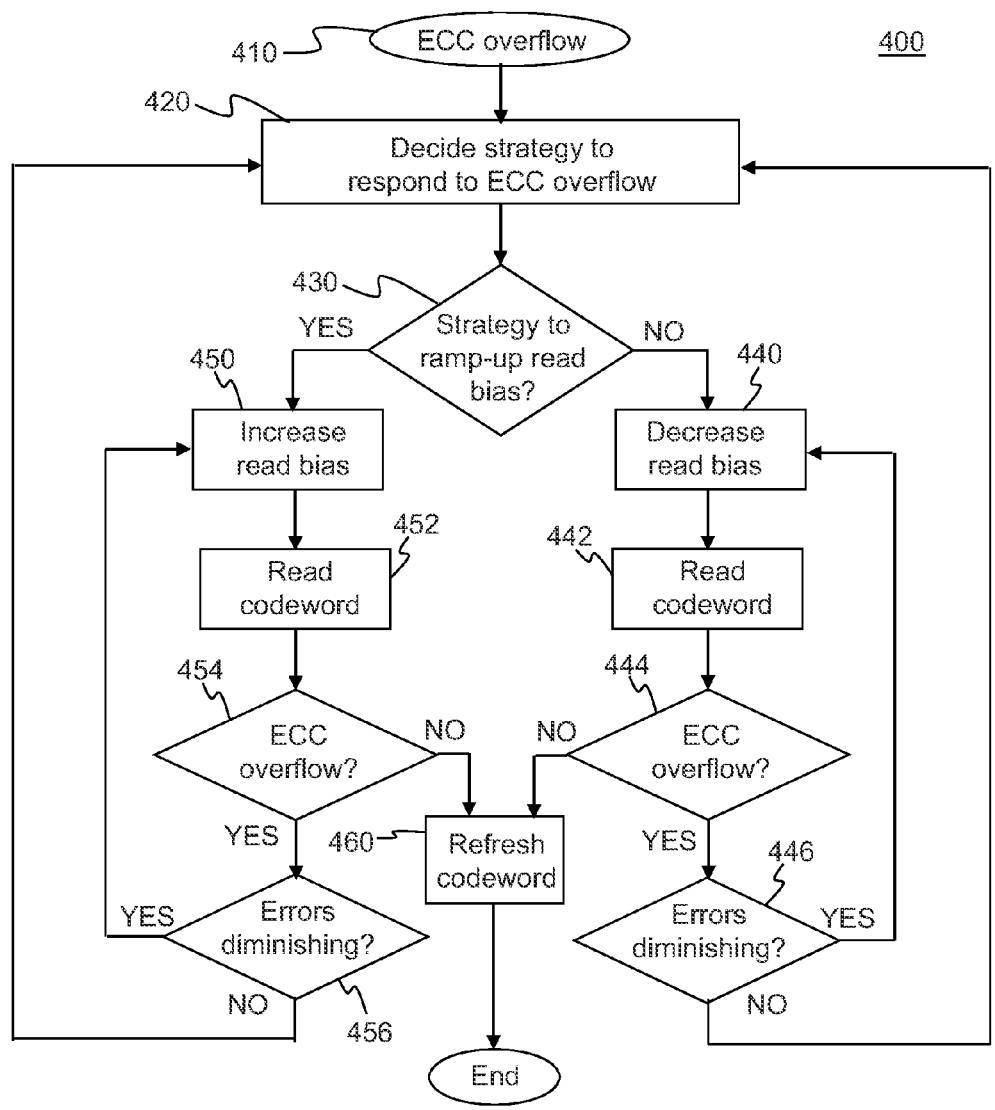
FIG. 4 is a flow diagram of a read process to read contents of a memory array, according to another embodiment.

FIG. 4 is a flow diagram of a read process 400 to read contents of a memory array, according to another embodiment. Process 400 may involve an ECC engine to detect and/or correct read errors, as described above. Similar to the case for process 300, subsequent to reading contents of a memory array, such an ECC engine may be used to correct read errors that may have occurred. However, an ECC overflow may occur if the number of read errors exceeds an ability of the ECC engine to correct such read errors. Process 400 begins with such an ECC overflow at oval 410. At block 420, a strategy to respond to such an ECC overflow may be determined. In one implementation, for example, a processor executing an application may determine such a strategy (e.g. number of iterations, voltage steps, etc). In another implementation, a memory controller may determine such a strategy. In any such case, such determining may be based, at least in part, on the extent of the ECC overflow (e.g., number of read errors beyond an error-correcting ability of an ECC engine), and/or based, at least in part, on whether an ECC word generated by an ECC engine comprises a bit imbalance.

If, for example, merely a few read errors beyond an error-correcting ability of an ECC engine have occurred, then a strategy to respond to the ECC overflow may include implementing another ECC engine that is more robust (e.g., able to correct more read errors) than the first ECC engine (which led to the ECC overflow). Implementing such a relatively robust ECC engine, however, may involve a cost: Such a robust ECC engine may utilize a relatively large portion of memory and/or processing resources. For example, relatively large portions of a memory array may be occupied by data involved in ECC processes as well as being occupied by executable code comprising the ECC engine itself. In addition, a relatively robust ECC engine may take a relatively long time to correct read errors. Thus, a strategy to respond to an ECC overflow need not involve a more robust ECC engine.

As mentioned above, a strategy to respond to an ECC overflow may be determined based, at least in part, on whether an ECC word comprises a bit imbalance. If so, process 400 may proceed to block 430 to begin a process of modifying read bias. In an implementation, to determine whether read bias is to be increased or decreased, the number of 1's and the number of 0's of a particular ECC word may be counted, for example. If the ECC word comprises a greater number of 0 bits than 1 bits, then process 400 may proceed to block 450, where read voltage may be increased by a particular amount. As discussed above, such an increase may compensate for a possibility that threshold voltage of a memory array may have drifted downward from the memory array's threshold voltage level during programming. At block 452, a process to read contents of the memory array may be performed again, this time using a higher read voltage than that used in the previous read (e.g., performed prior to the ECC overflow of oval 410). Such a read process may result in read errors, which may be detected using an ECC word generated by the read process. As may be determined at diamond 456 described below, the number of read errors may be fewer than the number of read errors that resulted from the previous read process. Although such a number of read errors may be fewer, the number of read errors may still be in excess of an error-correcting capability of an ECC engine. Such a case may thus involve an ECC overflow, as determined at diamond 454. If no overflow occurred, then process 400 may proceed to block 460, where coded data may be refreshed. On the other hand, in the event of an ECC overflow, process 400 may proceed to diamond 456 where a determination may be made as to whether the number of read errors, albeit enough to result in an ECC overflow, has decreased from the number of read errors that occurred prior to increasing read voltage at block 450. If such a decrease in the number of read errors has occurred, process 400 may return to block 450, where read voltage may be increased again for another iterative process of modifying read voltage. Accordingly, a determination may again be made at diamond 454 as to whether or not an ECC overflow occurred as a result of recently increased read voltage. If ECC overflow did not occur, then process 400 may proceed to block 460 to perform a refresh operation, as described above. On the other hand, process 400 may again proceed to diamond 456 where a determination may be made as to whether the number of read errors has decreased from the number of read errors that occurred prior to increasing read voltage at block 450. As described above, if such a decrease in the number of read errors has occurred, process 400 may once again return to block 450, where read voltage may be increased again for another iterative process of modifying read voltage. However, if such a decrease in the number of read errors has not occurred, process 400 may return to block 420, where a decision process to determine a strategy to respond to the ECC overflow may be revisited. As discussed above, strategy options may include implementing a more robust ECC engine, or any other strategy among a number of possibilities (e.g., changing step size, repeating a process of reading, applying a majority voting scheme, acquiring information from known patterns written into arrays (which may have undergone drift similar to that of read cells, such drift that may be known to a memory controller to provide information for a correction algorithm, for example))

Returning to diamond 430, if the ECC word comprises a greater number of 1 bits than 0 bits, then process 400 may proceed to block 440, where read voltage may be decreased by a particular amount. As discussed above, such a decrease may compensate for a possibility that threshold voltage of a memory array may have drifted upward from the memory array's threshold voltage level during programming. At block 442, a process to read contents of the memory array may be performed again, this time using a lower read voltage than that used in the previous read (e.g., performed prior to the ECC overflow of oval 410). Such a read process may result in read errors, which may be detected using an ECC word generated by the read process. As may be determined at diamond 446 described below, the number of read errors may be fewer than the number of read errors that resulted from the previous read process. Although such a number of read errors may be fewer, the number of read errors may still be in excess of an error-correcting capability of an ECC engine. Such a case may thus again involve an ECC overflow, as determined at diamond 444. If no overflow occurred, then process 400 may proceed to block 460, where a refresh operation may occur. On the other hand, in the event of an ECC overflow, process 400 may proceed to diamond 446 where a determination may be made as to whether the number of read errors, albeit enough to result in an ECC overflow, has decreased from the number of read errors that occurred prior to decreasing read voltage at block 440. If such a decrease in the number of read errors has occurred, process 400 may return to block 440, where read voltage may be decreased again for another iterative process of modifying read voltage. Accordingly, a determination may again be made at diamond 444 as to whether or not an ECC overflow occurred as a result of recently decreased read voltage. If ECC overflow did not occur, then process 400 may proceed to block 460 where a refresh operation may occur. On the other hand, process 400 may again proceed to diamond 446 where a determination may be made as to whether the number of read errors has decreased from the number of read errors that occurred prior to decreasing read voltage at block 440. As described above, if such a decrease in the number of read errors has occurred, process 400 may once again return to block 440, where read voltage may be decreased once again for another iterative process of modifying read voltage. However, if such a decrease in the number of read errors has not occurred, process 400 may return to block 420, where a decision process to determine a strategy to respond to the ECC overflow may be revisited. As discussed above, strategy options may include implementing a more robust ECC engine, or any other strategy among a number of possibilities.

Figure 5:
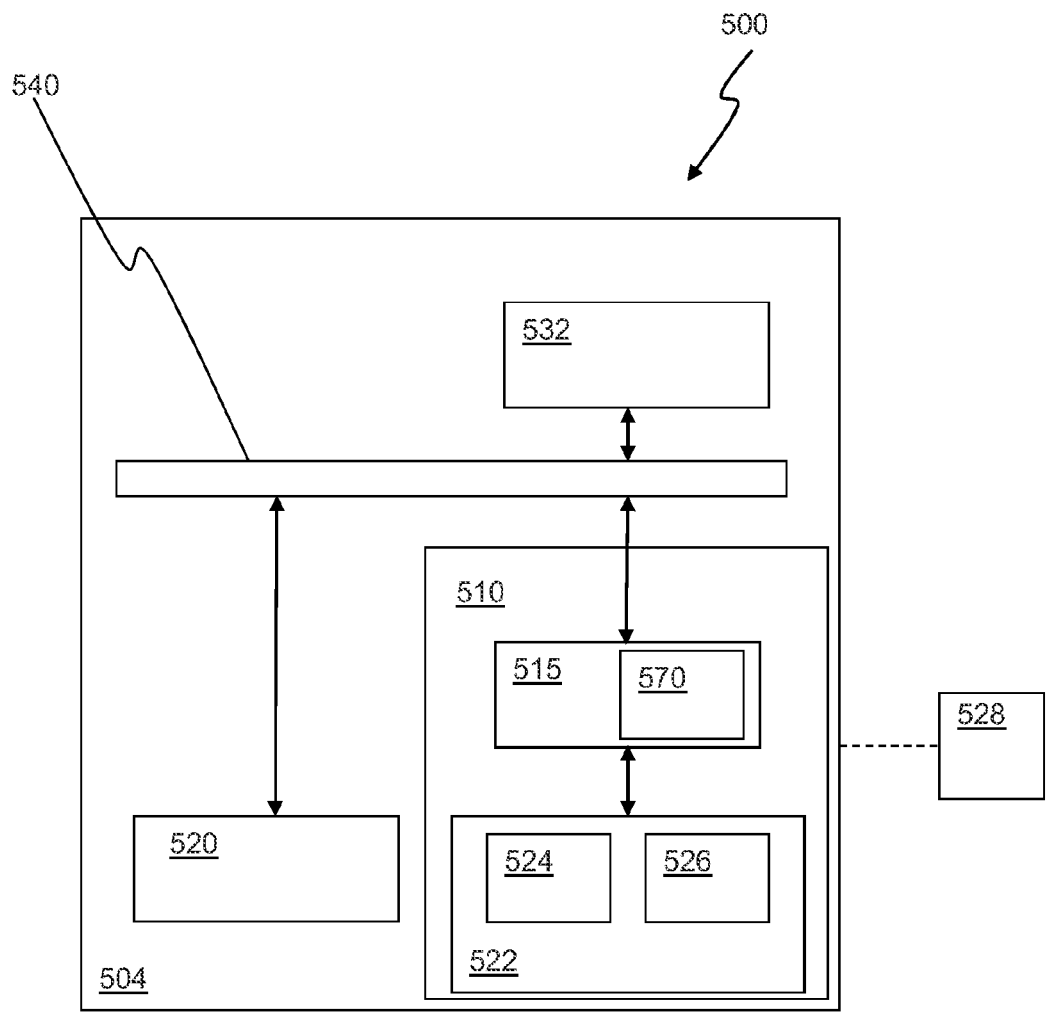
FIG. 5 is a schematic diagram illustrating an exemplary embodiment of a computing system.

FIG. 5 is a schematic diagram illustrating an exemplary embodiment of a computing system 500 including a memory device 510. Such a computing device may comprise one or more processors, for example, to execute an application and/or other code. For example, memory device 510 may comprise a PCM program buffer, such as program buffer 710 shown in FIG. 1. A computing device 504 may be representative of any device, appliance, or machine that may be configurable to manage memory device 510. Memory device 510 may include a memory controller 515 and a memory 522. By way of example but not limitation, computing device 504 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 500, and the processes and methods as further described herein, may be implemented using or otherwise including hardware, firmware, software, or any combination thereof. Thus, by way of example but not limitation, computing device 504 may include at least one processing unit 520 that is operatively coupled to memory 522 through a bus 540 and a host or memory controller 515. Processing unit 520 is representative of one or more circuits configurable to perform at least a portion of a data computing procedure or process. By way of example but not limitation, processing unit 520 may include one or more processors, controllers, microprocessors, microcontrollers, application specific integrated circuits, digital signal processors, programmable logic devices, field programmable gate arrays, and the like, or any combination thereof. Processing unit 520 may include an operating system configured to communicate with memory controller 515. Such an operating system may, for example, generate commands to be sent to memory controller 515 over bus 540. In one implementation, memory controller 515 may include an ECC engine 570 comprising circuitry and/or executable code to detect and/or correct read errors, as discussed above. For example, an ECC process performed by ECC engine 570 may be used to supplement programmed data with parity bits that include enough extra information for the data to be reconstructed if one or more bits of the data become corrupted. For example, such an ECC word representing stored data may be applied during a process of reading the stored data and/or a process of verify-after-writing the data.

Memory controller 515 may perform commands such as read and/or write commands initiated by processing unit 520. In response to a read command, for example, memory controller 515 may provide a bias signal, such as that shown in plot 210 or 220 in FIG. 2, for example, comprising a series of read voltages having individual voltage levels that sequentially increase or decrease from one read process to the next.

In particular, memory controller 515 may read contents of a memory 522 using a bias condition, and consequently count read errors resulting from reading the contents. Further, memory controller 515 may modify such a bias condition if, for example, the number of read errors exceeds a particular threshold number. In one implementation, memory controller 515 may determine a codeword representing read contents of memory 522 by using an ECC engine 570. In such a case, memory controller 515 may compare the number of bits of the codeword comprising a first logic state to the number of bits of the codeword comprising a second logic state. Such comparing may lead to a determination as to whether to increase or decrease the read bias condition for memory 522.

Memory 522 is representative of any data storage mechanism. Memory 522 may include, for example, a primary memory 524 and/or a secondary memory 526. Memory 522 may comprise PCM, for example. Primary memory 524 may include, for example, a random access memory, read only memory, etc. While illustrated in this example as being separate from processing unit 520, it should be understood that all or part of primary memory 524 may be provided within or otherwise co-located/coupled with processing unit 520.

In one embodiment, computing system 500 may comprise a program buffer including a PCM array and a PCM reference cell portion to store one or more particular reference states. System 500 may also include a controller to apply a bias pulse to a cell of the PCM array to produce a cell current in response to a read operation, and to modify the cell current based, at least in part, on a reference current resulting from the one or more particular reference states. System 500 may further include a processor to host one or more applications and to initiate the read operation.

Secondary memory 526 may include, for example, the same or similar type of memory as primary memory and/or one or more data storage devices or systems, such as, for example, a disk drive, an optical disc drive, a tape drive, a solid state memory drive, etc. In certain implementations, secondary memory 526 may be operatively receptive of, or otherwise configurable to couple to, a computer-readable medium 528. Computer-readable medium 528 may include, for example, any medium that can carry and/or make accessible data, code, and/or instructions for one or more of the devices in system 500.

Computing device 504 may include, for example, an input/output 532. Input/output 532 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 532 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
applying a bias condition to read contents of a memory device;
counting read errors in said read contents of said memory device;
determining coded data representing said read contents of said memory device by using an error correction code (ECC) engine; and
determining whether to increase or decrease said bias condition based, at least in part, on a comparison of a number of bits of said coded data in a first logic state to a number of bits of said coded data in a second logic state.

2. The method of claim 1, wherein said bias condition comprises a read bias voltage.

3. The method of claim 1, wherein said bias condition comprises a read bias voltage, and further comprising:
comparing a number of logic "0" bits of said coded data to a number of logic "1" bits of said coded data; and
increasing said bias condition in response to said number of logic "0" bits exceeding said number of logic "1" bits and decreasing said bias condition in response to said number of logic "1" bits exceeding said number of logic "0" bits.

4. The method of claim 1, further comprising:
iteratively modifying said bias condition until said number of said read errors comprises a number less than or equal to a threshold number.

5. The method of claim 1, wherein said memory device comprises a phase change memory (PCM).

6. The method of claim 1, wherein said modifying said bias condition is performed in response to an ECC overflow event.

7. The method of claim 1, further comprising:
sequentially stepping through multiple values of said bias condition; and
determining whether to continue said sequential stepping based, at least in part, on whether said number of said read errors comprises a number less than or equal to a threshold number.

8. The method of claim 1, further comprising modifying said bias condition in response to said count of errors exceeding a threshold number.

9. The method of claim 8, further comprising:
after modifying said bias condition, reading said contents of said memory device using said modified bias condition;
re-counting read errors resulting from said reading contents of said memory device; and
re-modifying said bias condition in response to said number of said read errors exceeding said threshold number.

10. An apparatus comprising:
a controller configured to:
apply a bias condition to read contents of a memory device;
count read errors in said read contents of said memory device;
determine a codeword representing said read contents of said memory device by using an error correction code (ECC) engine; and
determine whether to increase or decrease said bias condition based, at least in part, on a comparison of a number of bits of said codeword in a first logic state to a number of bits of said codeword in a second logic state.

11. The apparatus of claim 10, wherein said bias condition comprises a read bias voltage, and wherein said controller is further configured to:
compare a number of logic "0" bits of said codeword to a number of logic "1" bits of said codeword; and
increasing said bias condition in response to said number of logic "0" bits exceeding said number of logic "1" bits and decreasing said bias condition in response to said number of logic "1" bits exceeding said number of logic "0" bits.

12. The apparatus of claim 10, wherein said controller is further configured to iteratively modify said bias condition until said number of said read errors comprises a number less than or equal to a threshold number.

13. The apparatus of claim 10, wherein said memory device comprises a phase change memory (PCM).

14. The apparatus of claim 10, wherein said controller is further configured to:
modify said bias condition in response to said count of read errors exceeding a threshold number.

15. The apparatus of claim 14, wherein said controller is further configured to:
read, after modifying said bias condition, said contents of said memory device using said modified bias condition;
re-count read errors resulting from said reading contents of said memory device; and
re-modify said bias condition in response to said number of said read errors exceeding said threshold number.

16. A system comprising:
a memory device comprising a phase change memory (PCM) array, said memory device further comprising a memory controller configured to:
apply a bias condition to read contents of said memory device;
count read errors in said read contents of said memory device;
determine a codeword representing said read contents of said memory device by using an error correction code (ECC) engine; and
determine whether to increase or decrease said bias condition based, at least in part, on a comparison of a number of bits of said codeword in a first logic state to a number of bits of said codeword in a second logic state; and
a processor to host one or more applications and to initiate reading said contents of said PCM array.

17. The system of claim 16, wherein said controller is further configured to:
iteratively modify said bias condition until said number of said read errors comprises a number less than or equal to a threshold number.

18. The system of claim 16, wherein said controller is further configured to:
modify said bias condition in response to said count of read errors exceeding a threshold number.

19. The system of claim 18, wherein said controller is further configured to:
read, after modifying said bias condition, said contents of said memory device using said modified bias condition;
re-count read errors resulting from said reading contents of said memory device; and
re-modify said bias condition in response to said number of said read errors exceeding said threshold number.

20. The system of claim 16, wherein said bias condition comprises a read bias voltage, and wherein said controller is further configured to:
compare a number of logic "0" bits of said codeword to a number of logic "1" bits of said codeword; and
increasing said bias condition in response to said number of logic "0" bits exceeding said number of logic "1" bits and decreasing said bias condition in response to said number of logic "1" bits exceeding said number of logic "0" bits.

* * * * *